United States Patent
Sutardja et al.

(10) Patent No.: US 9,099,969 B2
(45) Date of Patent: Aug. 4, 2015

(54) CLASS AB AMPLIFIERS

(71) Applicant: Marvell World Trade LTD., St. Michael (BB)

(72) Inventors: Sehat Sutardja, Los Altos Hills, CA (US); Farbod Aram, Los Altos Hills, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 14/282,219

(22) Filed: May 20, 2014

(65) Prior Publication Data

US 2014/0253238 A1    Sep. 11, 2014

Related U.S. Application Data

(63) Continuation of application No. 13/769,700, filed on Feb. 18, 2013, now Pat. No. 8,736,374, which is a continuation of application No. 13/044,183, filed on Mar. 9, 2011, now Pat. No. 8,378,750.

(60) Provisional application No. 61/312,167, filed on Mar. 9, 2010.

(51) Int. Cl.
*H03F 3/18* (2006.01)
*H03F 3/26* (2006.01)
*H03F 3/21* (2006.01)
*H03F 3/191* (2006.01)

(52) U.S. Cl.
CPC ............ *H03F 3/265* (2013.01); *H03F 3/191* (2013.01); *H03F 3/211* (2013.01); *H03F 2203/21131* (2013.01)

(58) Field of Classification Search
CPC ...................................................... H03F 3/265
USPC ......................... 330/264, 255, 276, 302–305
See application file for complete search history.

(56) References Cited

U.S. PATENT DOCUMENTS 3,559,086 A    1/1971  Wyckoff
4,342,968 A    8/1982  Ritter
(Continued)

FOREIGN PATENT DOCUMENTS

DE    2917275 B1    8/1980
DE    4104980 A1    8/1992
DE    4340799 A1    6/1995

OTHER PUBLICATIONS

Extended European Search Report for European Application No. 13192544.8-1810 dated Apr. 28, 2014; 6 Pages.
(Continued)

*Primary Examiner* — Khanh V Nguyen
*Assistant Examiner* — Khiem Nguyen

(57) ABSTRACT

An amplifier including first, second, third, and fourth switches, each having first and second terminals. The first terminal of each switch communicates with a respective load. The second terminal of the first switch communicates with the second terminal of the second switch. The second terminal of the third switch communicates with the second terminal of the fourth switch. A first terminal of a first capacitance communicates with the second terminals of the first and second switches. A first terminal of a second capacitance communicates with the second terminals of the third and fourth switches. A first inductance communicates with second terminals of the first and second capacitances.

16 Claims, 9 Drawing Sheets

(56) References Cited

U.S. PATENT DOCUMENTS

| | | | |
|---|---|---|---|
| 5,235,288 | A | 8/1993 | Rinderle et al. |
| 6,781,459 | B1 | 8/2004 | Brown |
| 7,215,201 | B2 | 5/2007 | Roine |
| 7,323,939 | B2 * | 1/2008 | Han et al. .................. 330/311 |
| 7,764,124 | B2 | 7/2010 | Aram |
| 7,834,690 | B2 † | 11/2010 | Aram |
| 7,834,691 | B2 | 11/2010 | Aram |
| 8,058,938 | B2 † | 11/2011 | Aga |
| 8,081,032 | B1 * | 12/2011 | Aram ...................... 330/305 |
| 8,378,750 | B2 * | 2/2013 | Sutardja et al. ............ 330/264 |
| 2008/0079494 | A1 | 4/2008 | Aram |
| 2010/0019848 | A1 | 1/2010 | Rossi |

OTHER PUBLICATIONS

International Search Report and Written Opinion for corresponding International Application No. PCT/US2011/027756, mailed Aug. 10, 2011; 21 Pages.

Suematsu et al; CMOS/BICMOS Power Amplifier Technology Trend in Japan; GAAS IC Sumpsium; 23rd Annual IEEE Gallium Arsenide Integrated Circuit Symposium; Technical Digest 2001; Oct. 21-24, 2001; pp. 107-110.

* cited by examiner
† cited by third party

CLASS AB AMPLIFIERS

CROSS-REFERENCE TO RELATED APPLICATIONS

This is a continuation of U.S. patent application Ser. No. 13/769,700 (now U.S. Pat. No. 8,736,374), filed on Feb. 18, 2013 which is a continuation of U.S. patent application Ser. No. 13/044,183 (now U.S. Pat. No. 8,378,750), filed on Mar. 9, 2011, which claims the benefit of U.S. Provisional Application No. 61/312,167, filed on Mar. 9, 2010. The entire disclosures of the above applications are incorporated herein by reference.

FIELD

The present disclosure relates to amplifiers, and more particularly to class AB amplifiers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Class A amplifiers operate over an entire cycle of an input signal. An output signal is a scaled-up replica of the input signal. Class A amplifiers have a maximum efficiency of about 50% with inductive output coupling and about 25% with capacitive output coupling.

In Class A amplifiers, a transistor is biased such that the transistor is always conducting. The transistor is operated over a linear portion of the transistor's transfer characteristic. Because the transistor is always conducting, power is drawn from the power supply even when there is no input. If high output power is needed, power consumption (and the accompanying heat) may become significant.

Class B amplifiers amplify during half of an input cycle. As a result, Class B amplifiers tend to increase distortion but have higher efficiency than Class A amplifiers. Class B amplifiers have a maximum efficiency over 75%. Transistors are switched off half of the time and do not dissipate power at this time.

Class B amplifiers may use complementary transistor pairs (a "push-pull" transistor arrangement). Complementary devices amplify opposite halves of the input signal. Mismatch or crossover distortion may occur when re-joining the halves of the signal. One solution to the mismatch problem involves biasing the transistors to be just on, rather than completely off when not in use. This biasing approach is called Class AB operation. In other words, Class AB amplifying devices may include a class B output stage that is biased so that both transistors are conducting around a crossover point.

SUMMARY

A class AB amplifier includes a first inductor having a first terminal in communication with a voltage source terminal. A first transistor has a drain terminal in communication with a second terminal of the first inductor. A second transistor has a source terminal in communication with a source terminal of the first transistor. A second inductor has a first terminal in communication with a drain terminal of the second transistor and a second terminal in communication with a reference potential. The drain terminals of the first transistor and the second transistor are capacitively coupled together.

In other features, a first capacitance has a first terminal in communication with the source terminals of the first transistor and the second transistor. A second terminal of the first capacitance is in communication with a voltage input to the class AB amplifier.

In other features, a first capacitance has a first terminal in communication with gate terminals of the first transistor and the second transistor. A second terminal of the first capacitance is in communication with a voltage input to the class AB amplifier.

In other features, a first variable capacitance is connected in parallel with the first inductor. A second variable capacitance is connected in parallel with the second inductor. A first capacitance has a first terminal in communication with the drain terminal of the first transistor and a second terminal in communication with the drain terminal of the second transistor.

In other features, N capacitances have first terminals in communication with the drain terminal of the first transistor. N resistances have first terminals in communication with second terminals of respective ones of the N capacitances and have second terminals in communication with the drain terminal of the second transistor, wherein N is an integer greater than zero.

In other features, a third inductor has a first terminal in communication with the voltage source terminal. A third transistor has a drain terminal in communication with a second terminal of the third inductor. A fourth transistor has a source terminal in communication with a source terminal of the third transistor. A fourth inductor has a first terminal in communication with a drain terminal of the fourth transistor and a second terminal in communication with a reference potential. The drain terminals of the third transistor and the fourth transistor are capacitively coupled.

In other features, first and second capacitances are connected in series with each other and connected in parallel to the drain terminals of the first transistor and the second transistor, respectively. Third and fourth capacitances are connected in series with each other and connected in parallel to the drain terminals of the third transistor and the fourth transistor, respectively.

In other features, a fifth capacitance has a first terminal connected between the first and second capacitances and to the source terminals of the first transistor and the second transistor. The fifth capacitance has a second terminal connected between the third and fourth capacitances and to the source terminals of the third transistor and the fourth transistor. A sixth capacitance has one end that communicates with the first terminals of the first and second capacitances. A seventh capacitance has one end that communicates with the first terminals of the third and fourth capacitances.

In other features, an input driver includes a third transistor having a gate terminal in communication with an input signal, a tank circuit in communication with a terminal of the third transistor and a matching network in communication with the terminal of the third transistor and the source terminals of the first transistor and the second transistor.

In other features, a first capacitance has a first terminal in communication with the source terminals of the first transistor and the second transistor. A second capacitance has a first terminal in communication with the source terminals of the third transistor and the fourth transistor. A fifth inductor is in communication with second terminals of the first and second capacitances.

In other features, a fifth transistor has a gate terminal in communication with a first polarity of a differential input signal and a first terminal in communication with the second terminal of the first capacitance. A sixth transistor has a gate terminal in communication with a second polarity of the differential input signal and a first terminal in communication with the second terminal of the second capacitance.

In other features, a power combiner includes fifth, sixth, seventh and eighth inductors coupled to the first, second, third and fourth inductors, respectively. An antenna is connected to the power combiner. The first, second, third and fourth transistors and the first, second, third and fourth inductors are connected in a first loop. The fifth, sixth, seventh and eighth inductors are connected in a second loop that is arranged one of inside or outside of the first loop.

In other features, a first capacitance has a first terminal in communication with the source terminals of the first transistor and the second transistor. A second capacitance has a first terminal in communication with the source terminals of the third transistor and the fourth transistor. A fifth inductor is in communication with second terminals of the first and second capacitances. The first, second, third and fourth transistors and the first, second, third and fourth inductors are connected in a first loop. The fifth, sixth, seventh and eighth inductors are connected in a second loop that is arranged one of inside or outside of the first loop. The fifth inductor has a shape of number "8". The fifth inductor is located inside of the first loop and the second loop.

In other features, the first and second capacitances and the fifth inductor have a first impedance at a center frequency of the class AB amplifier and have second and third impedances at second and third harmonic frequencies, respectively, of the class AB amplifier. The second and third impedances are greater than the first impedance. The first transistor is an NMOS transistor and the second transistor is a PMOS transistor.

A class AB amplifier includes a first inductor having a first terminal in communication with a voltage source terminal. A first transistor has a drain terminal in communication with a second terminal of the first inductor. A second transistor has a source terminal in communication with a source terminal of the first transistor. A second inductor has a first terminal in communication with a drain terminal of the second transistor and a second terminal in communication with a reference potential. A third inductor has a first terminal in communication with the voltage source terminal. A third transistor has a drain terminal in communication with a second terminal of the third inductor. A fourth transistor has a source terminal in communication with a source terminal of the third transistor. A fourth inductor has a first terminal in communication with a drain terminal of the fourth transistor and a second terminal in communication with a reference potential. The drain terminals of the first transistor and the third transistor are capacitively coupled. The drain terminals of the second transistor and the fourth transistor are capacitively coupled. A first polarity of a differential signal is input to gates of the first and third transistors and a second polarity of the differential signal is input to gates of the second and fourth transistors.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The following description is merely illustrative in nature and is in no way intended to limit the disclosure, its application, or uses. As used herein, the phrase at least one of A, B, and C should be construed to mean a logical (A or B or C), using a non-exclusive logical OR. It should be understood that steps within a method may be executed in different order without altering the principles of the present disclosure.

Figure 2:
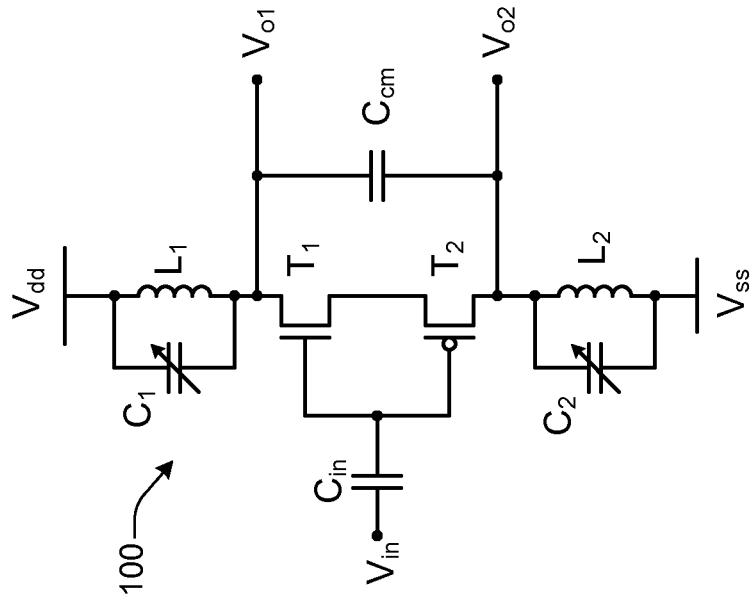
FIG. 2 is an electrical schematic of second push-pull class AB amplifier according to the present disclosure.
Figure 1:
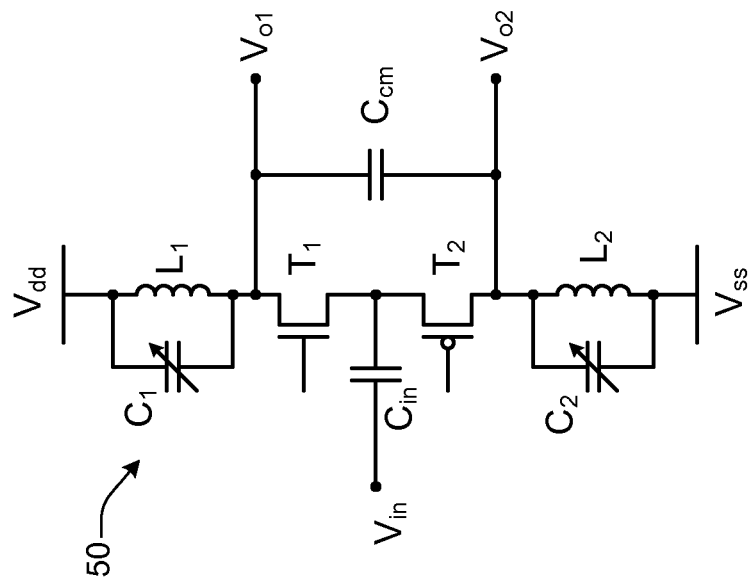
FIG. 1 is an electrical schematic of a first push-pull class AB amplifier according to the present disclosure.

Referring now to FIGS. 1 and 2, single-ended arrangements of push-pull class AB amplifiers 50 and 100 are shown. In FIG. 1, the amplifier 50 is arranged in a common gate configuration. The amplifier 50 includes a first inductor $L_1$, a first transistor $T_1$, a second transistor $T_2$ and a second inductor $L_2$, which are connected in series. The first transistor $T_1$ may be an NMOS transistor and the second transistor $T_2$ may be a PMOS transistor, although other types of transistors can be used. Inputs of the transistors $T_1$ and $T_2$ may be connected to AC ground or another bias or reference signal.

Variable capacitances $C_1$ and $C_2$ may be connected in parallel with the inductors $L_1$ and $L_2$, respectively. The inductor $L_1$ may be connected to a reference potential $V_{dd}$. The inductor $L_2$ may be connected to a ground potential $V_{ss}$.

A capacitance $C_{cm}$ may be connected to drain terminals of the first and second transistors $T_1$ and $T_2$. An input signal may be applied via an input capacitance $C_{in}$ to source terminals of the first and second transistors $T_1$ and $T_2$. Output signals $V_{o1}$ and $V_{o2}$ may be taken across terminals of the capacitance $C_{cm}$.

In FIG. 2, the push-pull class AB amplifier 100 is shown. The amplifier 100 is arranged in a common source configuration. The source terminals of the transistors $T_1$ and $T_2$ may be connected to AC ground or another bias or reference signal. The amplifier 100 is similar to the amplifier 50 except that the input signal $V_{in}$ is applied to gates of the first and second transistors $T_1$ and $T_2$.

In both FIGS. 1 and 2, the capacitance $C_{cm}$ removes even harmonics from the output signals $V_{o1}$ and $V_{o2}$ due to cancelling of the opposite phase of the even harmonics. The capacitance $C_{cm}$ tends to help transistor mismatch and to reduce distortion. Unlike conventional power amplifiers, the amplifiers 50 and 100 can have a voltage swing that is greater than $2V_{dd}$. The source node between the transistors $T_1$ and $T_2$ is floating and a low side can go below ground. The value of the capacitance $C_{cm}$ may be selected to be larger than the capacitances $C_1$ and $C_2$. The output signals $V_{o1}$ and $V_{o2}$ may be recombined in any suitable manner. In one example, inductive coupling via transformers may be used to recombine the output signals $V_{o1}$ and $V_{o2}$, as will be described below.

Figure 3:
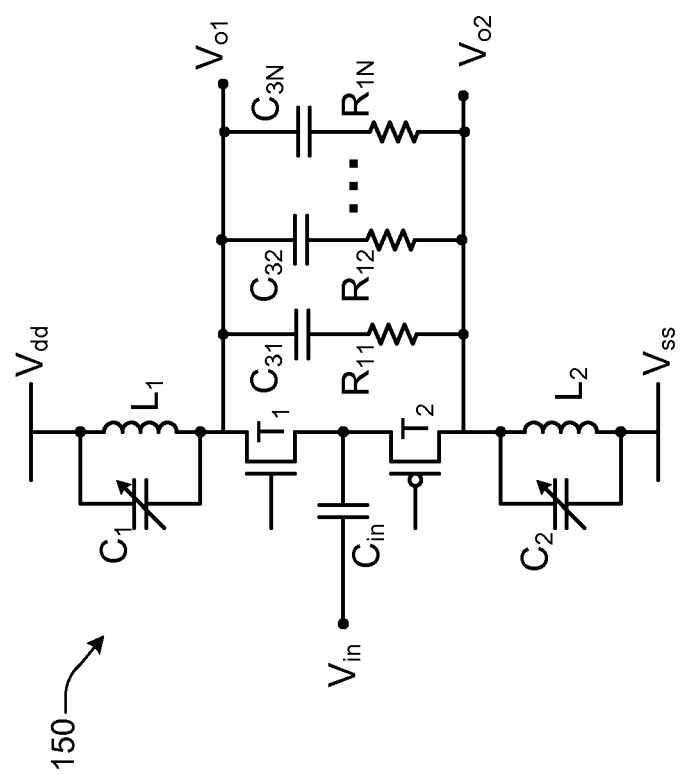
FIG. 3 is an electrical schematic of third push-pull class AB amplifier according to the present disclosure.

Referring now to FIG. 3, another push-pull class AB amplifier 150 is shown. The capacitance $C_{cm}$ is replaced by one or more series-connected capacitance and resistance pairs, which are connected in parallel across the first and second transistors $T_1$ and $T_2$. In particular, capacitances $C_{31}$, $C_{32}$, ..., and $C_{3N}$ are connected in series with resistances $R_{11}$, $R_{12}$, ..., and $R_{in}$, respectively, where N is an integer greater than zero. In some implementations, the capacitances $C_{31}$, $C_{32}$, ..., and $C_{3N}$ are selected to have the same or different values. In some implementations, the resistances $R_{11}$, $R_{12}$, ..., and $R_{in}$ are selected to have the same or different values. Using the capacitances and resistances may tend to reduce oscillation.

Figure 4:
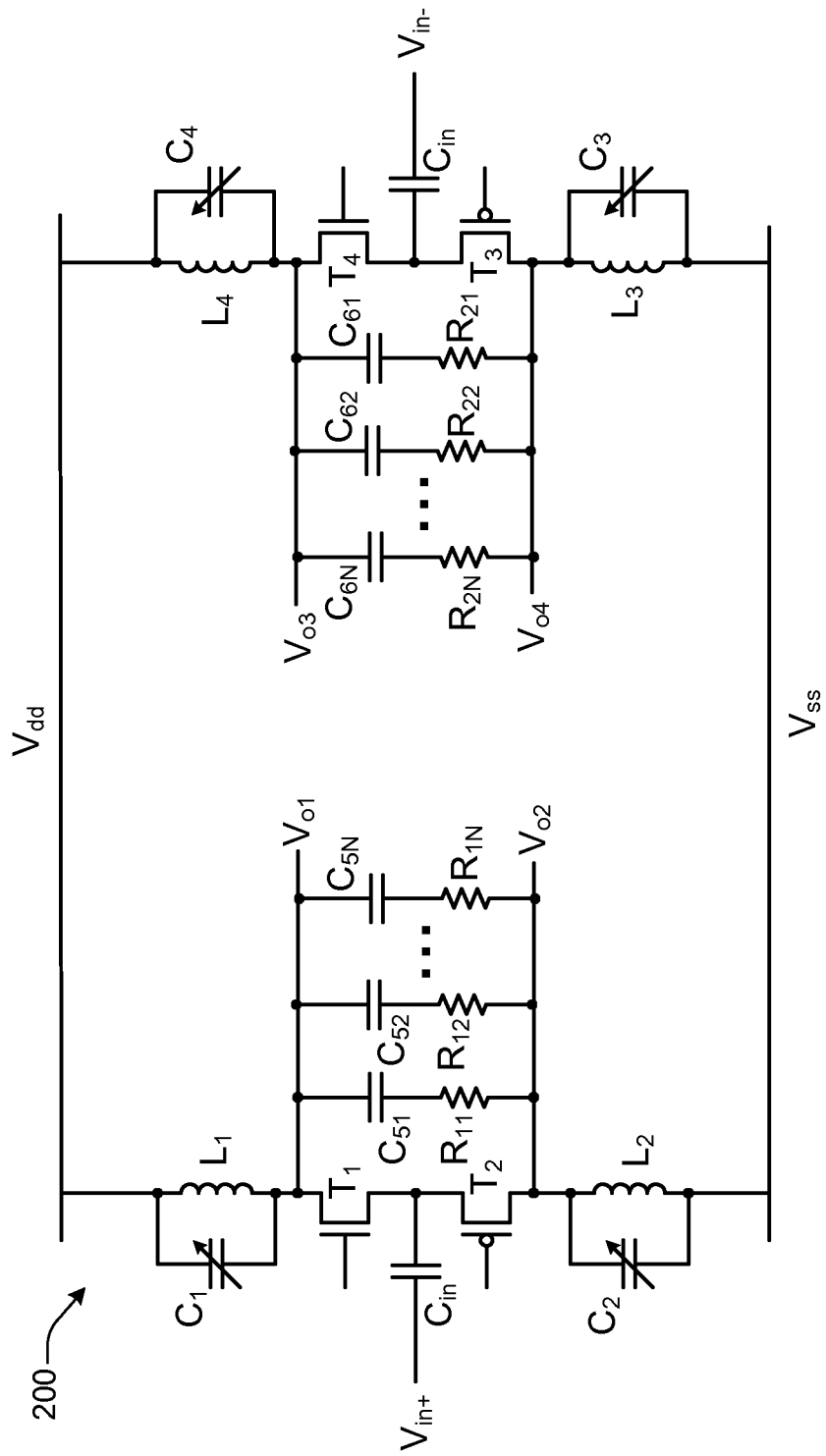
FIG. 4 is an electrical schematic of fourth push-pull class AB amplifier according to the present disclosure.

Referring now to FIG. 4, another push-pull class AB amplifier 200 is shown. The amplifier 200 is a differential implementation of the amplifier 150 of FIG. 3. The amplifier 200 further includes a third inductor $L_3$, a third transistor $T_3$, a fourth transistor $T_4$ and a fourth inductor $L_4$, which are connected in series. The fourth transistor $T_4$ may be an NMOS transistor and the third transistor $T_3$ may be a PMOS transistor, although other types of transistors can be used. Inputs of the transistors $T_1$ and $T_2$ and $T_3$ and $T_4$ may be connected to AC ground or another bias or reference signal.

Variable capacitances $C_3$ and $C_4$ may be connected in parallel with the inductors $L_3$ and $L_4$, respectively. The inductor $L_4$ may be connected to the reference potential $V_{dd}$. The inductor $L_3$ may be connected to the ground potential $V_{ss}$. A differential input signal may be applied via an input capacitance $C_{in}$ to source terminals of the third and fourth transistors $T_3$ and $T_4$. Output signals $V_{o3}$ and $V_{o4}$ may be taken across terminals of the third and fourth transistors $T_3$ and $T_4$.

Capacitances $C_{51}$, $C_{52}$, ..., and $C_{5N}$ are connected in series with resistances $R_{11}$, $R_{12}$, ..., and $R_{in}$, respectively, where N is an integer greater than zero. One or more pairs of the capacitances $C_{51}$, $C_{52}$, ... and $C_{5N}$ and the resistances $R_{11}$, $R_{12}$, ... and $R_{in}$ are connected in parallel across the third and fourth transistors $T_1$ and $T_2$. Capacitances $C_{61}$, $C_{62}$, ..., and $C_{6N}$ are connected in series with resistances $R_{21}$, $R_{22}$, ..., and $R_{2N}$, respectively, where N is an integer greater than zero. One or more pairs of the capacitances $C_{61}$, $C_{62}$, ... and $C_{6N}$ and the resistances $R_{21}$, $R_{22}$, ... and $R_{2N}$ are connected in parallel across the third and fourth transistors $T_3$ and $T_4$.

Figure 5:
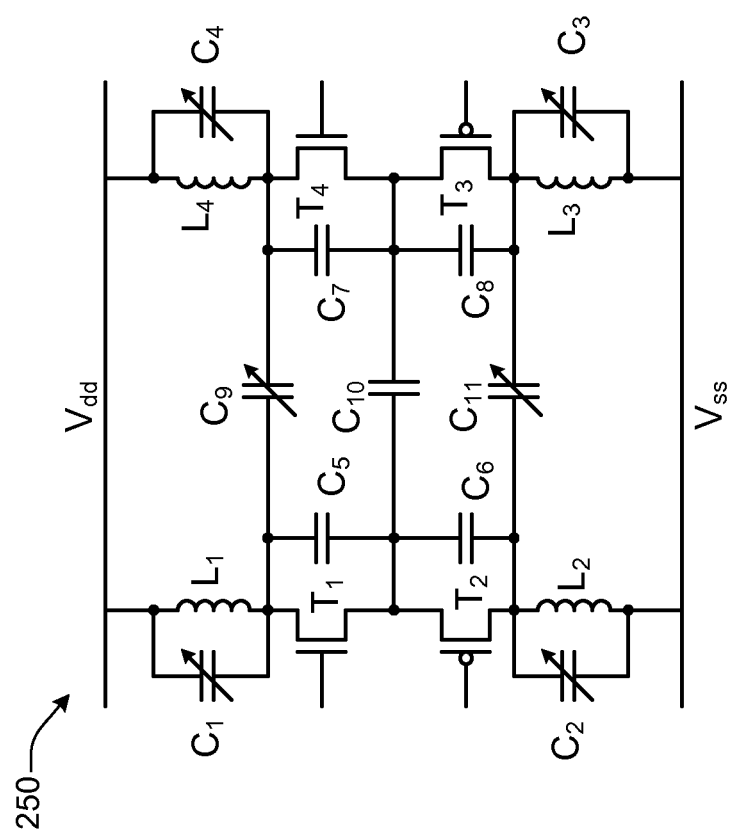
FIG. 5 is an electrical schematic of fifth push-pull class AB amplifier according to the present disclosure.

Referring now to FIG. 5, another push-pull amplifier 250 is shown. Additional capacitances $C_5$ to $C_{11}$ may be provided. The capacitances $C_5$ and $C_6$ replace one of the common mode capacitances $C_{cm}$ and are connected in series with each other and in parallel across the transistors $T_1$ and $T_2$. The capacitances $C_7$ and $C_8$ replace the other common mode capacitance $C_{cm}$ and are connected in series with each other and in parallel across the transistors $T_3$ and $T_4$. One end of a capacitance $C_{10}$ is connected to first terminals of the capacitances $C_5$ and $C_6$ and to the source terminals of the transistors $T_1$ and $T_2$. Another end of the capacitance $C_{10}$ is connected to first terminals of the capacitances $C_7$ and $C_8$ and to the source terminals of the transistors $T_3$ and $T_4$.

One end of a variable capacitance $C_{11}$ is connected to a second terminal of the capacitance $C_6$ and to the drain terminal of the transistors $T_2$. Another end of the variable capacitance $C_{11}$ is connected to a second terminal of the capacitance $C_8$ and to the drain terminal of the transistor $T_3$. One end of a variable capacitance $C_9$ is connected to a second terminal of the capacitance $C_5$ and to the drain terminal of the transistors $T_1$. Another end of the variable capacitance $C_9$ is connected to a second terminal of the capacitance $C_7$ and to the drain terminal of the transistor $T_4$. For example, an inductive coupling loop may couple with the inductors $L_1$, $L_2$, $L_3$ and $L_4$ to drive an output such as an antenna.

Figure 6:
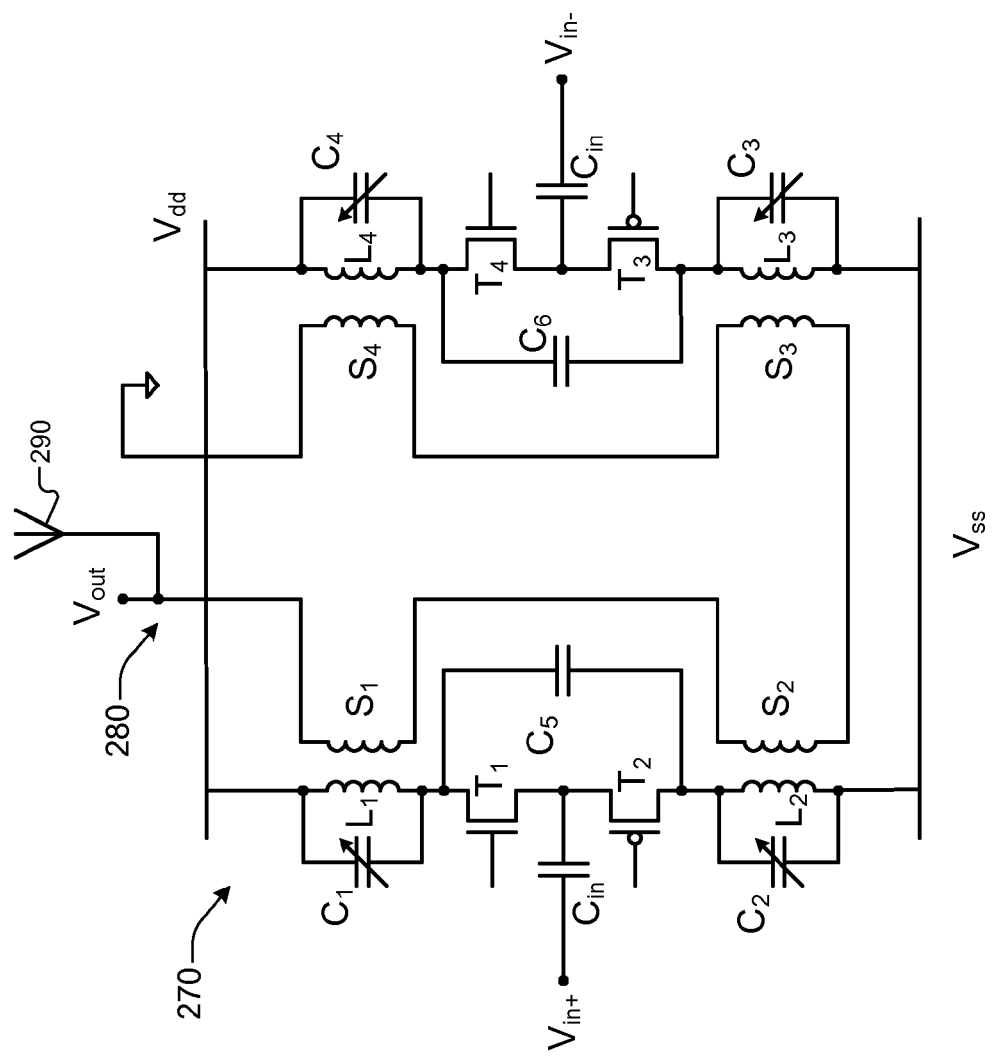
FIG. 6 is an electrical schematic of sixth push-pull class AB amplifier according to the present disclosure.

Referring now to FIG. 6, another push-pull class AB amplifier 270 is shown and includes a power combiner 280. The amplifier 270 includes a first inductor $L_1$, a first transistor $T_1$, a second transistor $T_2$ and a second inductor $L_2$, which are connected in series.

The amplifier 270 further includes a third inductor $L_3$, a third transistor $T_3$, a fourth transistor $T_4$ and a fourth inductor $L_4$, which are connected in series. Capacitances $C_1$, $C_2$, $C_3$ and $C_4$ may be variable capacitances that are arranged in parallel with the inductors $L_1$, $L_2$, $L_3$ and $L_4$. Common mode capacitances $C_5$ and $C_6$ are arranged in parallel with transistors $T_1$ and $T_2$ and $T_3$ and $T_4$, respectively.

The power combiner 280 includes first, second, third and fourth inductors $S_1$, $S_2$, $S_3$ and $S_4$, respectively, which are coupled to the first, second, third and fourth inductors $L_1$, $L_2$, $L_3$ and $L_4$, respectively, to create first, second, third and fourth transformers. In some examples, the output may be coupled to an antenna (not shown) or another load.

Figure 7:
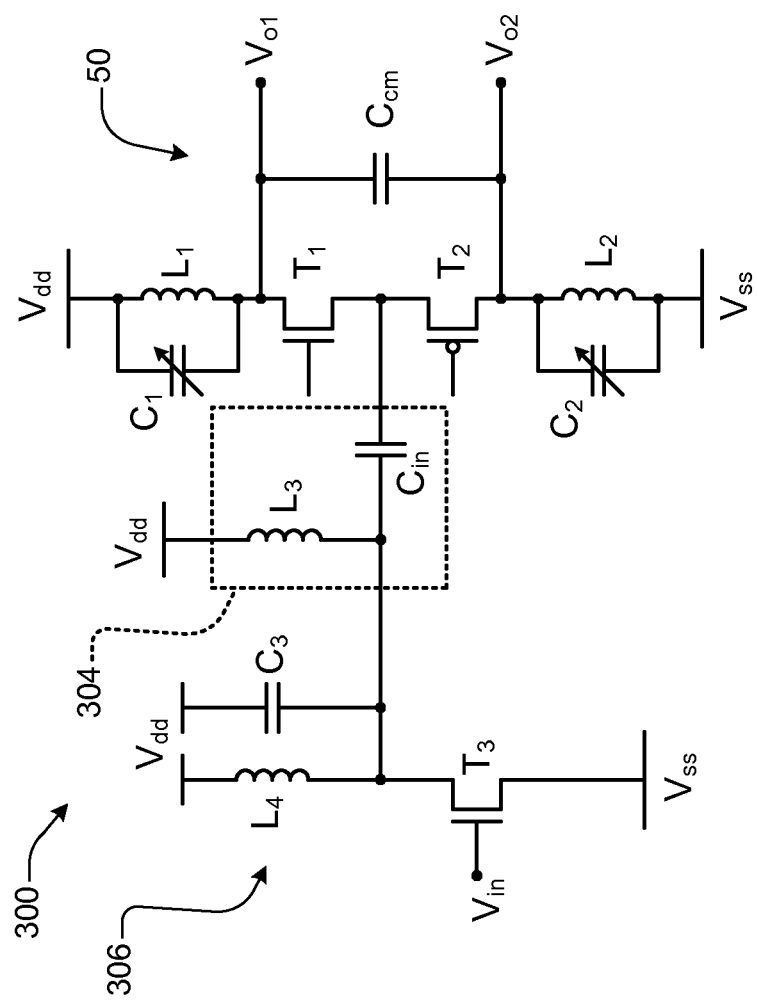
FIG. 7 is an electrical schematic of seventh push-pull class AB amplifier according to the present disclosure.

Referring now to FIG. 7, an example of an input driver 300 for the single ended amplifier 50 is shown. A matching network 304 includes the capacitance $C_{in}$ and an inductor $L_3$. A tank circuit 306 includes an inductor $L_4$ and a capacitance $C_3$. An input signal $V_{in}$ is input to a gate of a transistor $T_3$. The tank circuit 306 and the matching network 304 couple the input signal to the sources of the transistors $T_1$ and $T_2$.

Figure 8:
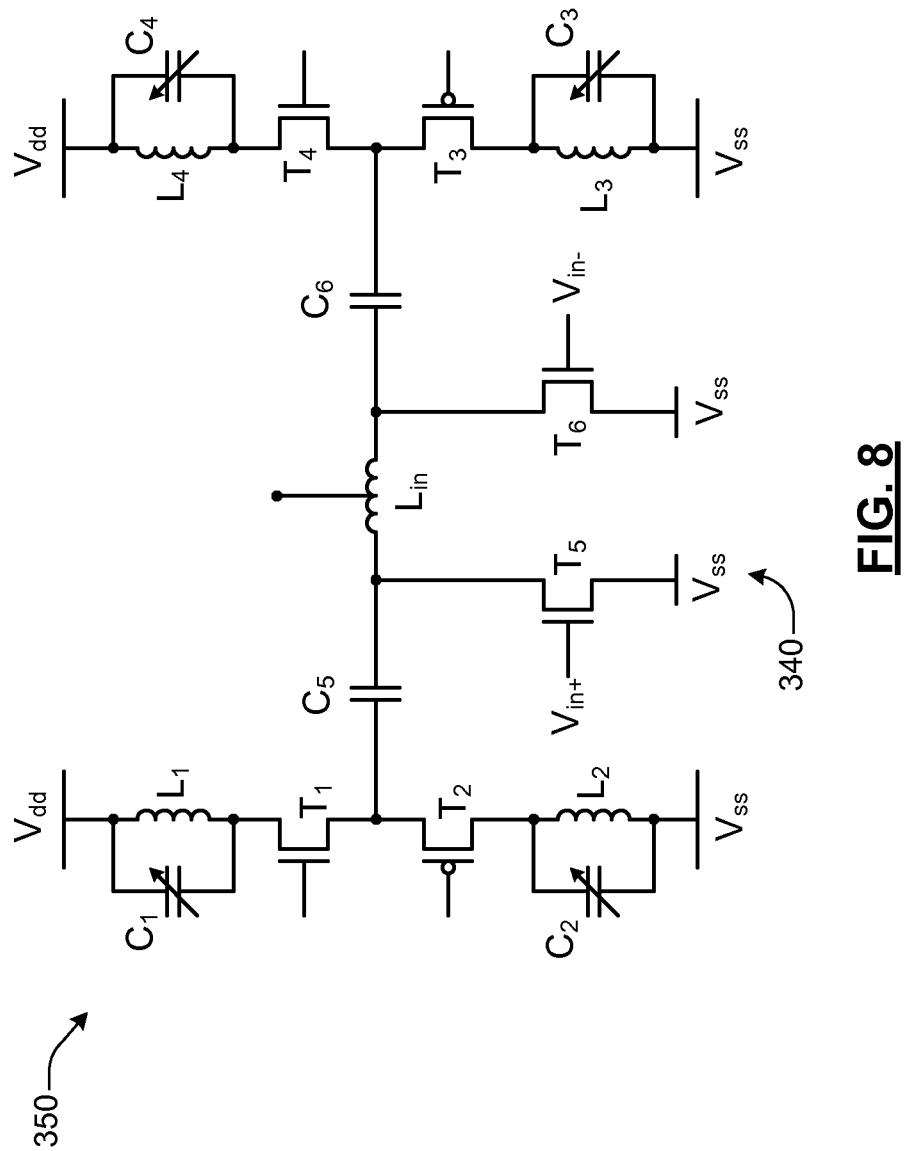
FIG. 8 is an electrical schematic of eighth push-pull class AB amplifier according to the present disclosure.

Referring now to FIG. 8, an example of an input driver 340 for a differential amplifier 350 is shown. The amplifier 350 includes the components of the amplifier 50. The amplifier 350 further includes a third inductor $L_3$, a third transistor $T_3$, a fourth transistor $T_4$ and a fourth inductor $L_4$, which are connected in series. Inputs of the transistors $T_1$, $T_2$, $T_3$, and $T_4$ may be connected to AC ground or another bias or reference signal. Variable capacitances $C_3$ and $C_4$ may be connected in parallel with the inductors $L_3$ and $L_4$, respectively. The inductor $L_4$ may be connected to the reference potential $V_{dd}$. The inductor $L_3$ may be connected to the ground potential $V_{ss}$.

Capacitance $C_5$, inductor $L_{in}$ and capacitance $C_6$ are connected in series between the sources of the transistors $T_1$ and $T_2$ and the sources of transistors $T_3$ and $T_4$. Drains (or sources) of the transistors $T_5$ and $T_6$ are connected between the inductor $L_{in}$ and the capacitances $C_5$ and $C_6$, respectively. Sources (or drains) of the transistors $T_5$ and $T_6$ are connected to $V_{ss}$. One polarity of the differential input signal $V_{in+}$ is coupled to a gate of the transistor $T_5$ and the other polarity of the differential input signal $V_{in-}$ is coupled to a gate of the transistor $T_6$. The inductor $L_{in}$ may have a center tap that may be connected to a bias signal, a reference potential or a ground potential.

The connection provided by the capacitances $C_5$ and $C_6$ and the inductor $L_{in}$ provides source degeneration. The connection provides a low impedance connection such as a short circuit at a center frequency and a higher impedance connection at other frequencies. For example, the connection has high impedance at second and third harmonic frequencies.

Figure 9:
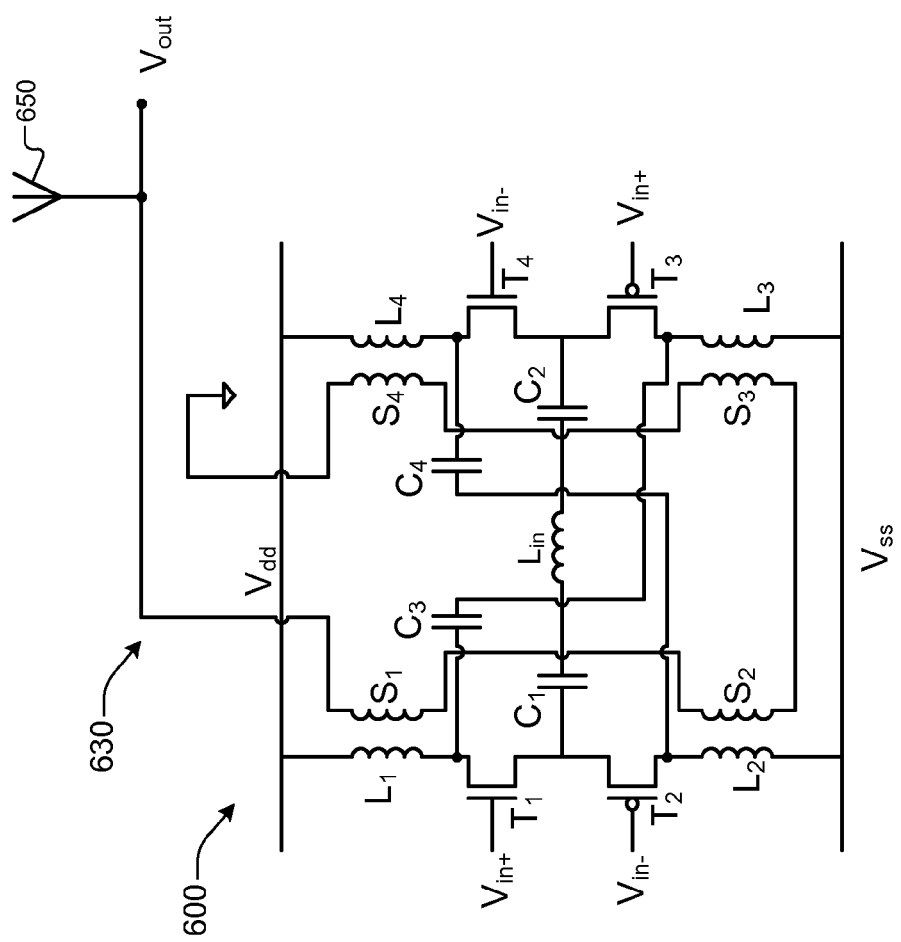
FIG. 9 is an electrical schematic of ninth push-pull class AB amplifier according to the present disclosure.

Referring now to FIG. 9, another push-pull class AB amplifier 600 is shown and includes a power combiner 630. The amplifier 600 includes a first inductor $L_1$, a first transistor $T_1$, a second transistor $T_2$ and a second inductor $L_2$, which are connected in series. The amplifier 600 further includes a third inductor $L_3$, a third transistor $T_3$, a fourth transistor $T_4$ and a fourth inductor $L_4$, which are connected in series. A first capacitance $C_1$, an inductor $L_{in}$ and a second capacitance $C_2$ are connected in series. The first capacitance $C_1$ is also connected to source terminals of the first and second transistors $T_1$ and $T_2$. The second capacitance $C_2$ is also connected to source terminals of the third and fourth transistor $T_3$ and $T_4$. Capacitance $C_3$ is connected to drains of the transistors $T_1$ and $T_3$. Capacitance $C_4$ is connected to drains of the transistors $T_2$ and $T_4$. A first polarity of the differential signal $V_{in+}$ is input to gates of transistors $T_1$ and $T_3$. A second polarity of the differential signal $V_{in-}$ is input to gates of transistors $T_2$ and $T_4$.

The power combiner 630 includes first, second, third and fourth inductors $S_1$, $S_2$, $S_3$ and $S_4$, respectively, which are coupled to the first, second, third and fourth inductors $L_1$, $L_2$, $L_3$ and $L_4$, respectively, to create first, second, third and fourth transformers. In some examples, the output may be coupled to an antenna (not shown) or another load.

Figure 10:
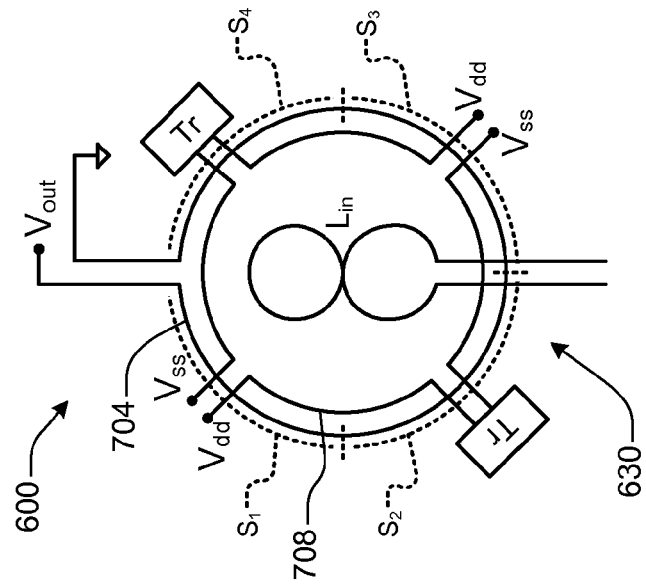
FIG. 10 is an example partial layout of a push-pull class AB amplifier with a power combiner according to the present disclosure.

Referring now to FIG. 10, an example layout of the amplifier 600 and the power combiner 630 is shown. A first loop 704 includes the first, second, third and fourth inductors $S_1$, $S_2$, $S_3$ and $S_4$, respectively. A second loop 708 provides connections to the transistor pairs, $V_{dd}$ and $V_{ss}$. The first and second loops 704 and 708 may have a circular, elliptical, rectangular, square or other generally closed shape. The inductor $L_{in}$ may be arranged inside or outside of the first and second loops 704 and 708. The inductor $L_{in}$ may have a shape of number "8". The first loop 704 may be arranged inside or outside of the second loop 708 in a plan view. The current in the first loop 704 may flow through the inductors $S_1$, $S_2$, $S_3$ and $S_4$ in the same direction.

Figure 11:
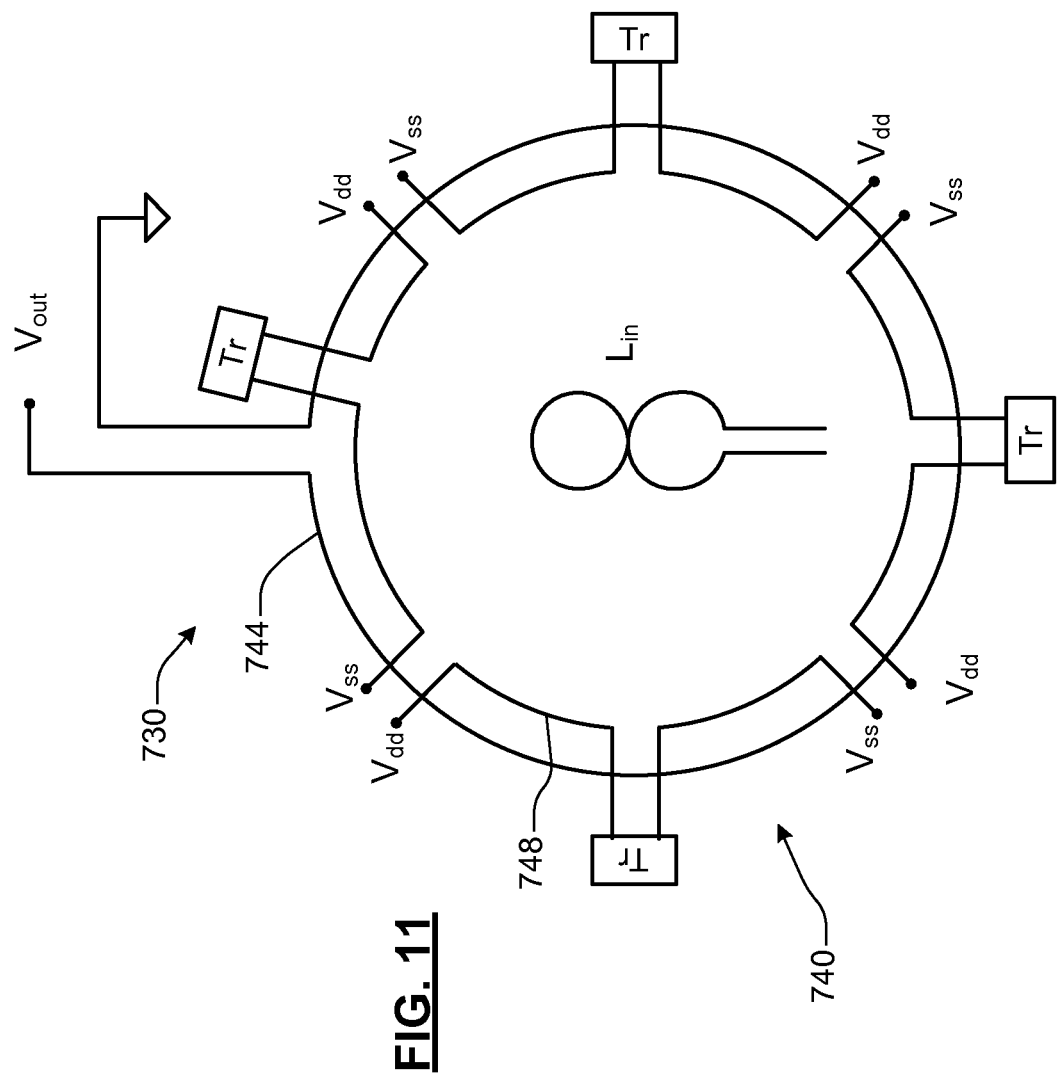
FIG. 11 is an example partial layout of another push-pull class AB amplifier with a power combiner according to the present disclosure.

While two legs are shown for example in FIGS. 5 and 6, additional legs with additional transistor pairs can be used. Referring now to FIG. 11, an example layout of an amplifier 730 and a power combiner 740 for four pairs of transistors is shown. A first loop 744 includes inductors that couple with inductors in a second loop 748. For example only, the first and second loops 744 and 748 may have a circular, elliptical, rectangular, square or other generally-closed shape. The inductor $L_{in}$ may be arranged inside or outside of the first and second loops 744 and 748. The first loop 744 may be arranged inside or outside of the second loop 748 in a plan view.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An amplifier, comprising:
a first switch having a first terminal, a second terminal, and a control terminal, wherein the first terminal communicates with a first tank circuit;
a second switch having a first terminal, a second terminal, and a control terminal, wherein the first terminal of the second switch communicates with a second tank circuit, and wherein the second terminal of the second switch communicates with the second terminal of the first switch;
a third switch having a first terminal, a second terminal, and a control terminal, wherein the first terminal of the third switch communicates with a third tank circuit;
a fourth switch having a first terminal, a second terminal, and a control terminal, wherein the first terminal of the fourth switch communicates with a fourth tank circuit, and wherein the second terminal of the fourth switch communicates with the second terminal of the third switch;
a first capacitance connected in series to a second capacitance, wherein the first capacitance is connected across the first and second terminals of the first switch, and wherein the second capacitance is connected across the first and second terminals of the second switch;
a third capacitance connected in series with a fourth capacitance, wherein the third capacitance is connected across the first and second terminals of the third switch, and wherein the fourth capacitance is connected across the first and second terminals of the fourth switch;
a fifth capacitance having a first terminal and a second terminal, wherein the first terminal of the fifth capacitance communicates with the first terminal of the first switch, and wherein the second terminal of the fifth capacitance communicates with the first terminal of the fourth switch; and
a sixth capacitance having a first terminal and a second terminal, wherein the first terminal of the sixth capacitance communicates with the first terminal of the second switch, and wherein the second terminal of the sixth capacitance communicates with the first terminal of the third switch.

2. The amplifier of claim 1, further comprising:
the first, second, third, and fourth tank circuits,
wherein each of the first, second, third, and fourth tank circuits comprises (i) an inductance and (ii) a variable capacitance.

3. The amplifier of claim 1, further comprising:
the first, second, third, and fourth tank circuits,
wherein the first and third tank circuits are connected to a first potential, and
wherein the second and fourth tank circuits are connected to a second potential.

4. The amplifier of claim 1, further comprising:
a seventh capacitance having a first terminal and a second terminal,
wherein the first terminal of the seventh capacitance is connected between the first and second capacitances and to the second terminals of the first and second switches, and
wherein the second terminal of the seventh capacitance is connected between the third and fourth capacitances and to the second terminals of the third and fourth switches.

5. An amplifier, comprising:
a first switch having a first terminal and a second terminal, wherein the first terminal communicates with a first load;
a second switch having a first terminal and a second terminal, wherein the first terminal of the second switch communicates with a second load, and wherein the second terminal of the second switch communicates with the second terminal of the first switch;
a third switch having a first terminal and a second terminal, wherein the first terminal of the third switch communicates with a third load;
a fourth switch having a first terminal and a second terminal, wherein the first terminal of the fourth switch communicates with a fourth load, wherein the second terminal of the fourth switch communicates with the second terminal of the third switch;
a first capacitance having a first terminal and a second terminal, wherein the first terminal of the first capacitance is in communication with the second terminals of the first and second switches;
a second capacitance having a first terminal and a second terminal, wherein the first terminal of the second capacitance is in communication with the second terminals of the third and fourth switches; and a first inductance in communication with second terminals of the first and second capacitances.

6. The amplifier of claim 5, wherein:
each of the first, second, third, and fourth loads comprises a tank circuit;
wherein the tank circuit includes (i) a second inductance and (ii) a variable capacitance;
wherein the first and fourth tank circuits are connected to a supply voltage; and
wherein the second and third tank circuits are connected to a reference voltage.

7. The amplifier for claim 5, further comprising:
a fifth switch having a first terminal, a second terminal, and a control terminal, wherein the first terminal of the fifth switch is in communication with the second terminal of the first capacitance, wherein the second terminal of the fifth switch is in communication with a reference voltage, and wherein the control terminal of the fifth switch is in communication with a first input of the amplifier; and
a sixth switch having a first terminal, a second terminal, and a control terminal, wherein the first terminal of the sixth switch is in communication with the second terminal of the second capacitance, wherein the second terminal of the sixth switch is in communication with the reference voltage, wherein the control terminal of the sixth switch is in communication with a second input of the amplifier.

8. The amplifier of claim 5, wherein:
each of the first, second, third, and fourth loads comprises a second inductance;
wherein the first and fourth loads are connected to a supply voltage; and
wherein the second and third loads are connected to a reference voltage.

9. The amplifier of claim 5, wherein:
each of the first, second, third, and fourth switches includes a control terminal,
the control terminals of the first and third switches receive a first input of the amplifier, and
the control terminals of the second and the fourth switches receive a second input of the amplifier.

10. The amplifier of claim 5, further comprising:
a third capacitance having a first terminal and a second terminal, wherein the first terminal of the third capacitance is in communication with the first terminal of the first switch, and wherein the second terminal of the third capacitance is in communication with the first terminal of the third switch; and
a fourth capacitance having a first terminal and a second terminal, wherein the first terminal of the fourth capacitance is in communication with the first terminal of the fourth switch, and wherein the second terminal of the fourth capacitance is in communication with the first terminal of the second switch.

11. The amplifier of claim 5, wherein:
the first and second capacitances and the first inductance have a first impedance at a center frequency of the amplifier;
the first and second capacitances and the first inductance have second and third impedances respectively at second and third harmonic frequencies of the amplifier; and
the second and third impedances are greater than the first impedance.

12. The amplifier of claim 5, wherein the first inductance has a shape of number "8".

13. The amplifier of claim 5, further comprising:
four series-connected inductances;
wherein the four series-connected inductances are coupled respectively to the first, second, third, and fourth loads; and
wherein the four series-connected inductances couple an output of the amplifier to an antenna.

14. The amplifier of claim 13, wherein:
the first, second, third, and fourth loads are connected in a first loop; and
the four series-connected inductances are connected in a second loop.

15. The amplifier of claim 14, wherein the first loop and the second loop are concentric.

16. The amplifier of claim 14, wherein the first inductance is arranged inside the first loop and the second loop.

* * * * *